(12) United States Patent
Bhushan et al.

(10) Patent No.: US 8,456,169 B2
(45) Date of Patent: Jun. 4, 2013

(54) HIGH SPEED MEASUREMENT OF RANDOM VARIATION/YIELD IN INTEGRATED CIRCUIT DEVICE TESTING

(75) Inventors: Manjul Bhushan, Hopewell Junction, NY (US); Mark B. Ketchen, Yorktown Heights, NY (US); Qingqing Liang, Beijing (CN); Edward P. Maciejewski, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 601 days.

(21) Appl. No.: 12/686,476

(22) Filed: Jan. 13, 2010

(65) Prior Publication Data

US 2011/0169499 A1 Jul. 14, 2011

(51) Int. Cl.
*G01R 31/02* (2006.01)

(52) U.S. Cl.
USPC ............. 324/537; 324/750.3; 324/762.01; 324/762.09

(58) Field of Classification Search
USPC ........... 324/750.3, 73.1, 537, 762.01–762.02, 324/762.09; 331/57; 702/64, 66, 79; 714/733–734, 744; 326/16, 97
See application file for complete search history.

(56) References Cited

U.S. PATENT DOCUMENTS

| | | | |
|---|---|---|---|
| 4,584,662 A | 4/1986 | Lin | |
| 4,795,964 A * | 1/1989 | Mahant-Shetti et al. | ..... 324/681 |
| 6,060,921 A | 5/2000 | Daniell | |
| 6,809,540 B2 * | 10/2004 | Beech | ..... 324/757.01 |
| 6,980,009 B2 * | 12/2005 | Maciejewski et al. | ..... 324/671 |
| 7,038,482 B1 | 5/2006 | Bi | |
| 7,439,755 B2 | 10/2008 | Jenkins et al. | |
| 7,484,139 B2 | 1/2009 | Watts | |
| 7,537,939 B2 | 5/2009 | Ziger et al. | |
| 7,542,867 B2 | 6/2009 | Steger et al. | |
| 2005/0043908 A1 | 2/2005 | Bhavnagarwala et al. | |

FOREIGN PATENT DOCUMENTS

JP 2008123306 A 5/2008

OTHER PUBLICATIONS

Agarwal, K. et al. "A Test Structure for Characterizing Local Device Mismatches." Proceeding of Symposium on VLSI Circuits, pp. 67-68, 2006.
V. Wang et al., "A Simplified Design Model for Random Process Variability", IEEE Transactions on Semiconductor Manufacturing, vol. 22, No. 1, Feb. 2009.

* cited by examiner

*Primary Examiner* — Arleen M Vazquez
(74) *Attorney, Agent, or Firm* — Cantor Colburn LLP; Ian MacKinnon

(57) ABSTRACT

A test structure is provided that utilizes a time division sampling technique along with a statistical modeling technique that uses metal-oxide-semiconductor field effect transistor (MOSFET) saturation and linear characteristics to measure the mean (average) and sigma (statistical characterization of the variation) of a large population of electrical characteristics of electrical devices (e.g., integrated circuits) at high speed. Such electrical characteristics or sampling parameters include drive currents, leakage, resistances, etc.

20 Claims, 8 Drawing Sheets

HIGH SPEED MEASUREMENT OF RANDOM VARIATION/YIELD IN INTEGRATED
CIRCUIT DEVICE TESTING

BACKGROUND

The present invention relates generally to integrated circuit device testing techniques and, more particularly to test structures and techniques for high-speed measurement of random variation/yield (sigma) in integrated circuit devices.

In general, variations in device characteristics include "systematic" variations and "random" variations. Systematic variations (or process variation) are variations in a manufacturing process that equally affect some or all N-doped or P-doped elements of a local circuit depending on e.g., the orientation, geometry and/or location of a device. For example, when manufacturing a semiconductor chip, systematic variations in device characteristics can result from variations in mask dimensions (which causes geometry variations), variations in material properties of wafers, resists, etc., variations in the manufacturing equipment and environment (e.g., lens aberrations, flow turbulence, oven temperature, etc.) and variations in process settings (diffusion time, focus, exposure energy, etc.). Systematic variations typically have significant spatial correlations, i.e., circuits/devices that are near each other can be expected to have the same/similar amount of variations due to systematic sources of variation.

In contrast, random variations in device characteristics between devices of a circuit, wafer, chip or lot, are uncorrelated. Random sources of variations, which cause device mismatch between neighboring devices in a circuit, can adversely affect circuit behavior even more drastically than systematic variations in circuits such as SRAM cells and sense amplifiers. Thus, random variations in device characteristics cause significantly more deviation especially in circuit performance of the above mentioned circuits, than systematic variations. Since random variations in device characteristics are uncorrelated, methods for characterizing or modeling such random variation are difficult and inaccurate.

As device features keep scaling down smaller and smaller, the random variation becomes critical since it can directly impact yield. As devices are scaled down creating more variation, statistical characterization of important. However, it is usually time consuming to measure key parameters (e.g., mean and sigma) of the variation and not for in-line measurement. A solid model needs a large sample size and many applications (e.g., drive currents at different bias conditions, resistances, and leakage currents), which makes test time an issue.

SUMMARY

According to one embodiment of the present invention, a method for measuring random variation in integrated devices is provided. The method includes acquiring an average of a sampling current for a plurality of electrical devices; extracting the average of the sampling current for the plurality of devices by coupling an electrical element to the plurality of electrical devices, the electrical element operably transfers the average of the sampling current to an applied voltage on a transistor device coupled to the electrical element and the plurality of electrical devices; and biasing the transistor device at a first biasing region and at a second biasing region to determine a sigma of one or more electrical characteristics of the plurality of electrical devices.

According to another embodiment of the present invention, a method for measuring random variation in integrated devices is provided. The method includes acquiring an average of a sampling current for a plurality of electrical devices; extracting the average of the sampling current for the plurality of devices by coupling an electrical element to the plurality of electrical devices, the electrical element operably transfers the average of the sampling current to an applied voltage on a transistor device coupled to the electrical element and the plurality of electrical devices; and biasing the transistor device at a saturation region and at a linear region to determine a sigma of one or more electrical characteristics of the plurality of electrical devices.

According to yet another embodiment of the present invention, a test structure is provided. The test structure includes a plurality of electrical devices; an oscillating circuit in electrical communication with the plurality of devices, the oscillating circuit configured to drive the plurality of electrical devices at different time divisions of a sampling period to acquire an average of a sampling current for the plurality of electrical devices; and an electrical element in electrical communication with the plurality of electrical devices, the electrical element operably transfers the average of the sampling current for the plurality of electrical devices to an applied voltage to a transistor device coupled with the plurality of electrical devices, the transistor device is biased at a first biasing region and at a second biasing region to determine a sigma of one or more electrical characteristics of the plurality of electrical devices.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

It should be understood that the structure of p-Channel Field Effect Transistors (PFETs) and n-Channel Field Effect Transistors (NFETs) used in exemplary embodiments of the present invention in their simplest form include a gate electrode over a gate dielectric over a channel region in a semiconductor substrate with a source and drain formed in the substrate on opposite sides of the channel region. It is contemplated that other structurally complex PFETs and NFETs as known in the art may be used in exemplary embodiments of the present invention.

The term "controller" as used herein refers to an application specific integrated circuit (ASIC), and electronic circuit, a processor (shared, dedicated, or group) and memory that executes one or more software or firmware programs/algorithms, a combinational logic circuit, and/or other suitable components that provide the described functionality.

Figure 1A:
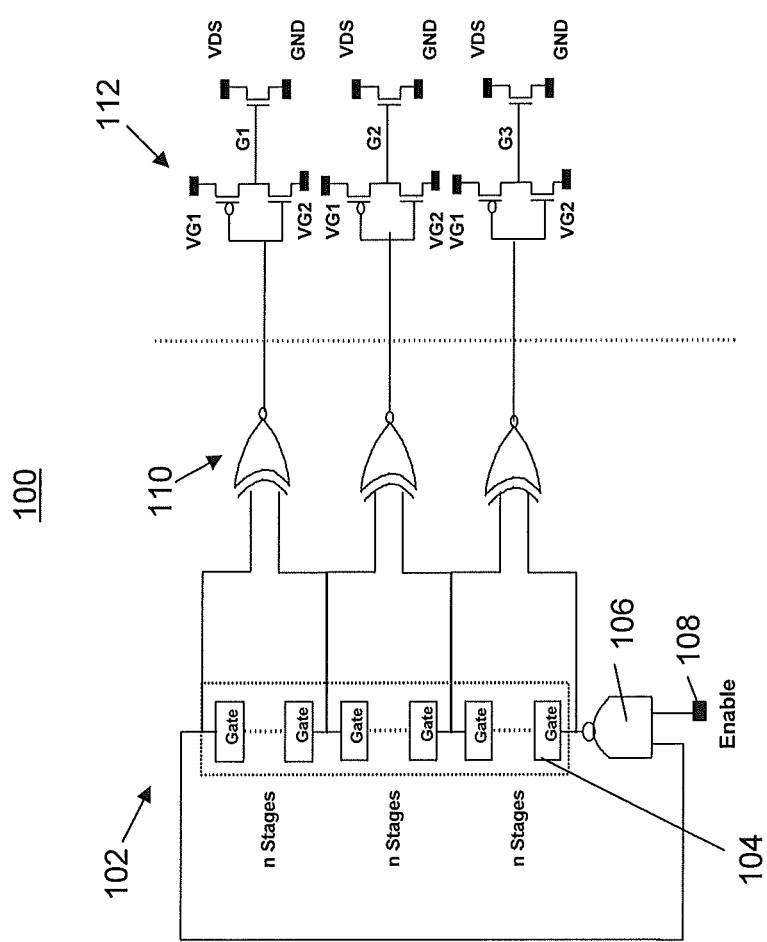
FIG. 1 is a schematic of a ring oscillator circuit of a test structure in accordance with one exemplary embodiment of the present invention.
FIG. 1B are exemplary waveforms generated by the ring oscillator circuit of the test structure in accordance with one exemplary embodiment of the present invention.

FIG. 1A illustrates a test structure 100 in accordance with one exemplary embodiment. The test structure 100 utilizes a time division sampling technique along with a statistical modeling technique that uses metal-oxide-semiconductor field effect transistor (MOSFET) saturation and linear characteristics to measure the mean (average) and sigma (statistical characterization of the variation) of a large population of electrical characteristics of electrical devices (e.g., integrated circuits) at high speed. Such electrical characteristics or sampling parameters include drive currents, leakage, resistances, etc. The test structure and techniques described herein provide a general method for measuring the average and sigma of many electrical characteristics on a large sample size at high data speeds.

In accordance with one embodiment, the test structure 100 includes a ring oscillator circuit 102 to generate a waveform of pulses for sampling data at different time divisions of a sampling time period in order to obtain the average of the drive or sampling current for different samples or devices under test. In operation, a small pulse (e.g., 1 nanosecond) is provided to each device respectively in order to sample each device during the sampling time period (e.g., 1 microsecond). As such, each device is quickly sampled during the sampling time period in order to obtain an average of the sampling current for the devices. The ring oscillator circuit 102 allows the pulses generated for each device to be staggered such that one pulse is not overlapping another pulse. In this way, the devices are turned on sequentially during the sampling time period contributing equally in that sampling period/window.

The ring oscillator circuit 102 can be any conventional ring oscillator circuit for generating a waveform of pulses. In one exemplary configuration, the ring oscillator circuit 102 generally includes a first plurality of inverter circuits 104 that make up m×n-stages in the ring oscillator circuit 102, where m=3 for the case shown and n is an even number. A chain of inverters is cascaded as shown in FIG. 1. Each inverter circuit 104 generally comprises a NFET/PFET pair and the bottom inverter is coupled to a logic gate 106 (i.e., NAND gate) having an enable input pin 108 that operably enables the signal from the top inverter to travel sequentially down to the bottom inverter through the logic gate 106, and then back to the top inverter. The sub-groups of n inverter circuits 104 are operably coupled to logic gates 110 (i.e., logic exclusive NOR gates), which in turn are coupled to other inverters 112. Each of the inverters 112 generally comprises a NFET/PFET pair for driving one of the devices under test. Logic gates 110 feed a signal respectively into the gates of the inverter circuits 112 so that the devices are driven or turned on one at a time. It is contemplated that other configurations of a ring oscillator circuit or other means for driving each device sequentially for a short time within the sampling window can be used in other exemplary embodiments and should not be limited to the configuration described herein. However, for ease of discussion, exemplary embodiments of the test structure will be described in the context of a ring oscillator.

Figure 1B:
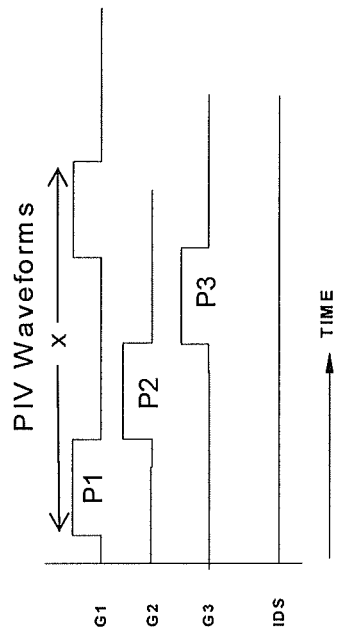

The ring oscillator circuit 102 is configured to generate a waveform of pulses to each device as depicted in FIG. 1B. In this example, waveform G1 is provided to a first device, waveform G2 is provided to a second device, and waveform G3 is provided to a third device. Although only three waveforms are generated, any number of waveforms can be generated depending on the number of devices in any given circuit. As shown, each waveform is generated so that only one device is turned on at one given time during the sampling window. In this example, pulses P1, P2, and P3 are provided to the first, second and third device respectively and are each a ratio of the sampling window (x).

In accordance with one exemplary embodiment, a plurality of samples or devices 120A-120C coupled in parallel are in electrical communication with the ring oscillator circuit 102, which quickly drives each device 120A-120C sequentially within the sampling window (x) as shown in FIG. 1B. Specifically in this example, waveform G1 is provided to 120A, waveform G2 is provided to device 120B, and waveform G3 is provided to 120C. Although only three devices 120 are shown, it should be understood that any number of devices can be tested utilizing the time division sampling technique described above and should not be limited to the example described herein. Thus, the average and the sigma of a number of electrical characteristics or parameters (e.g., drive current, resistance, etc.) can be measured on a large sample size at high speeds. The devices 120 can be any electrical component or integrated device having electrical characteristics/parameters. For instance, the devices 120 can be NFETS, resistors, etc.

Figure 2:
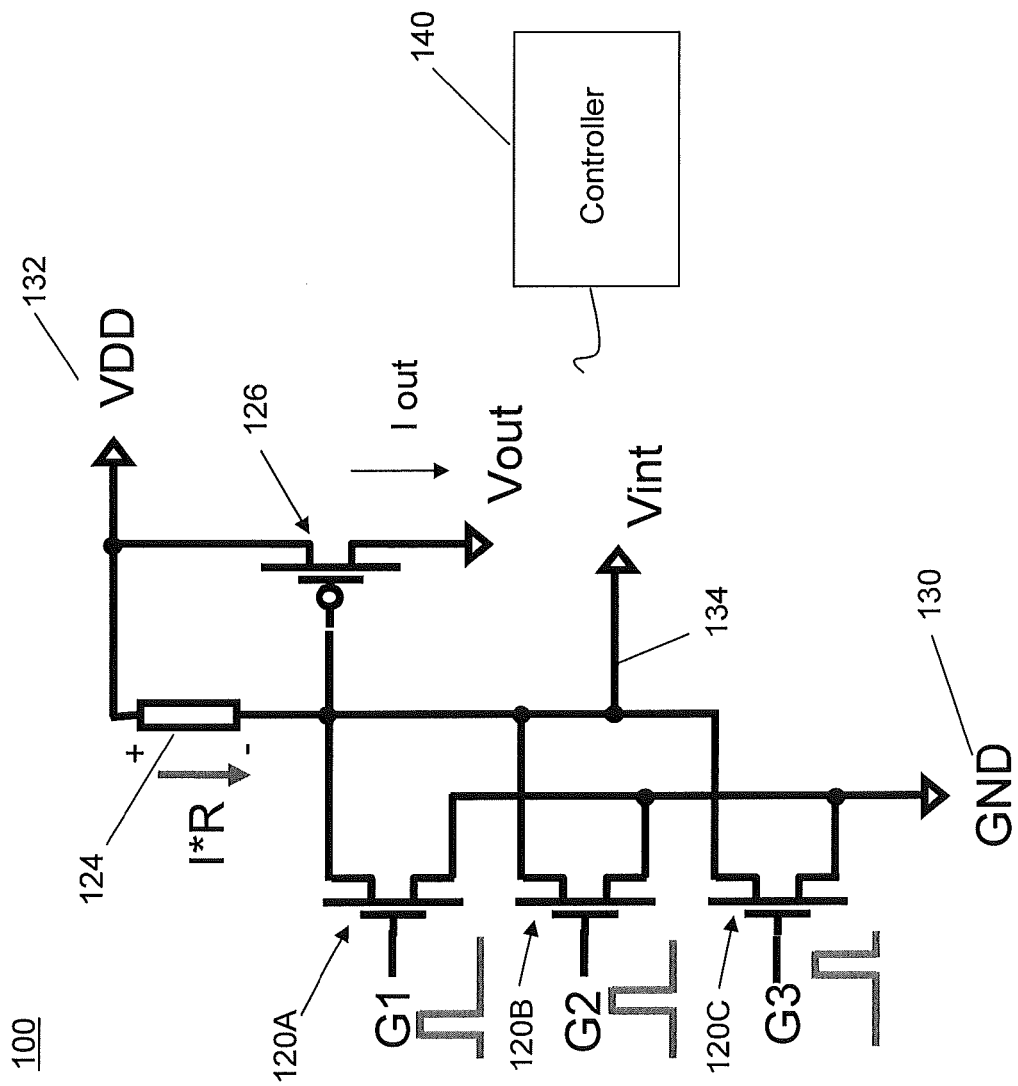
FIG. 2 is a schematic of a test structure for measuring a sigma of a first sampling parameter in accordance with one exemplary embodiment of the present invention.

Electrical characteristics of each of the sampling devices 120 are extracted from the devices at fixed bias conditions utilizing a statistical modeling technique. In this example, the average of the different sampling currents for the sampling devices 120A-120C is extracted to enable for the determination of the sigma of the sampling parameter (e.g., drive current) in each device. This is accomplished by coupling an electrical element 124 to one end (i.e., source side) of each one of the sampling devices 120A-120C as shown in FIG. 2. The electrical element 124 is also coupled in parallel with a transistor device 126, which in this example is a PFET. Of course, the transistor device 126 can be an NFET or other structurally complex device FET in accordance with other embodiments and is dependent on the configuration of the sampling devices under test.

The electrical element 124 is used to transfer the sampling current (I) for devices 120A-120C to a voltage (IR=$V_{DD}$−$V_{int}$), where ($V_{DD}$−$V_{int}$) is the applied gate voltage on the transistor device 126. In this example, one end (i.e., source terminal) of each of the devices 120A-120C is coupled to a common ground 130, denoted as ground GND, while another end (i.e., drain terminal) is coupled to the electrical element 124, which in turn receives power from a power source 132 denoted as power source $V_{DD}$. In this embodiment, the electrical element 124 is a resistor. Of course, the electrical element can be any other type of electrical component/device (e.g., diode) used to transfer the sampling current for the devices. An electrical pad 134 between the electrical element 124 and the source of device 120C enables for the measurement of the basic electrical characteristics of the electrical element 124 and the electrical characteristics of the transistor device 126 used to determine the sigma of any electrical characteristic/sampling parameter of the sampling devices 120A-120C.

The test structure 100 described above is used to characterize the random variation/yield or sigma of any sampling parameter/electrical characteristic of the sampling devices 120A-120C. In the example shown in FIG. 2, the sigma of the drive current for sampling devices 120A-120C is measured. Of course, characterizing the random variation of other electrical characteristics of the devices can be measured.

In accordance with one embodiment, a controller 140 implements a statistical modeling technique that utilizes Monte Carlo analysis and parameter distributions (e.g., Normal/Gaussian) to measure the statistical characterization of the variation (sigma) of sampling parameters of the devices. The controller can implement the auto-measurement of characteristics of devices 124 and 126, and mean and sigma as shown in the equations below.

The controller 140 is in electrical communication with the test structure 100 and is configured to measure the mean (average) and sigma of electrical characteristics of devices 120A-120C. In operation, the resistance R is measured between $V_{DD}$ and $V_{int}$. The DC characteristics of transistor device 126 are measured at least two different biasing conditions. Specifically, the transistor device 126 is biased at a linear region (e.g., $V_{out}=V_{DD}-0.05V$) and a saturation region (e.g., $V_{out}=V_{DD}-1.5V$) as the ring oscillator circuit 102 operates to obtain the average of the sampling current for the sampling devices 120A-120C. The ring oscillator circuit 102 operates according to the time division sampling technique as described above to obtain the average of sampling currents. As such, the sampling current (I) changes as a function of time.

The transistor device 126 is biased at a linear region and a saturation region by changing $V_{DD}$ accordingly utilizing conventional techniques. As such, the sigma of electrical characteristics (e.g., drive current) of the sampling devices 120A-120C can be determined utilizing equation (1):

$$\sigma^2 = \int x(p)^2 dp - (\int x(p)dp)^2 = \overline{x^2} - \overline{x}^2 \qquad \text{(equation 1)}$$

As shown in equation 1, the sigma ($\sigma^2$) of electrical characteristics (e.g., drive currents) of the devices 120A-120C is determined by calculating the average of the square of the drive current, represented as ($\overline{x^2}$) in equation 1, for the devices 120A-120C and the square of the average of the drive current, represented as ($\overline{x}^2$) in equation 1, for the devices 120A-120C.

The average of the square of the drive current is determined by measuring the output current ($I_{out}$) of the transistor device 126 when the transistor device 126 is placed in the saturation region. The output current ($I_{out}$) of the transistor device 126 in the saturation region is directly proportional to the average of the square of the drive current (x) and is calculated by utilizing Equation (2):

$$I_{OUT} = \frac{K}{2}\overline{(IR - V_{TH})^2} \qquad \text{(equation 2)}$$

In this equation, $I_{out}$ is a function of resistance (R), the sampling current (I), the threshold voltage ($V_{TH}$) of the transistor device 126, and the transconductance (K) of the transistor device 126.

The square of the average of the drive current is calculated by determining the output current ($I_{out}$) of the transistor device 126 when the transistor device 126 is placed in the linear region. The output current ($I_{out}$) of the transistor device 126 in the linear region is directly proportional to the square of the average drive current (x) and is calculated by utilizing Equation (3):

$$I_{OUT} = K\left(\overline{IR} - V_{TH} - \frac{1}{2}(V_{DD} - V_{out})\right)(V_{DD} - V_{out}) \qquad \text{(equation 3)}$$

In this equation, $I_{out}$ is a function of resistance (R), the sampling current (I), the threshold voltage ($V_{TH}$) of the transistor device 126, and the transconductance (K) of the transistor device 126, the biasing voltage $V_{DD}$ and the output voltage $V_{out}$.

As such, the sigma in equation 1 can be measured by calculating the output current of the transistor device 126 when the transistor device 126 is placed in both the saturation region and the linear region using equations 2 and 3. This sigma is the statistical characterization of the random variation of the drive current in each of the sampling devices 120A-120C.

Figure 3:
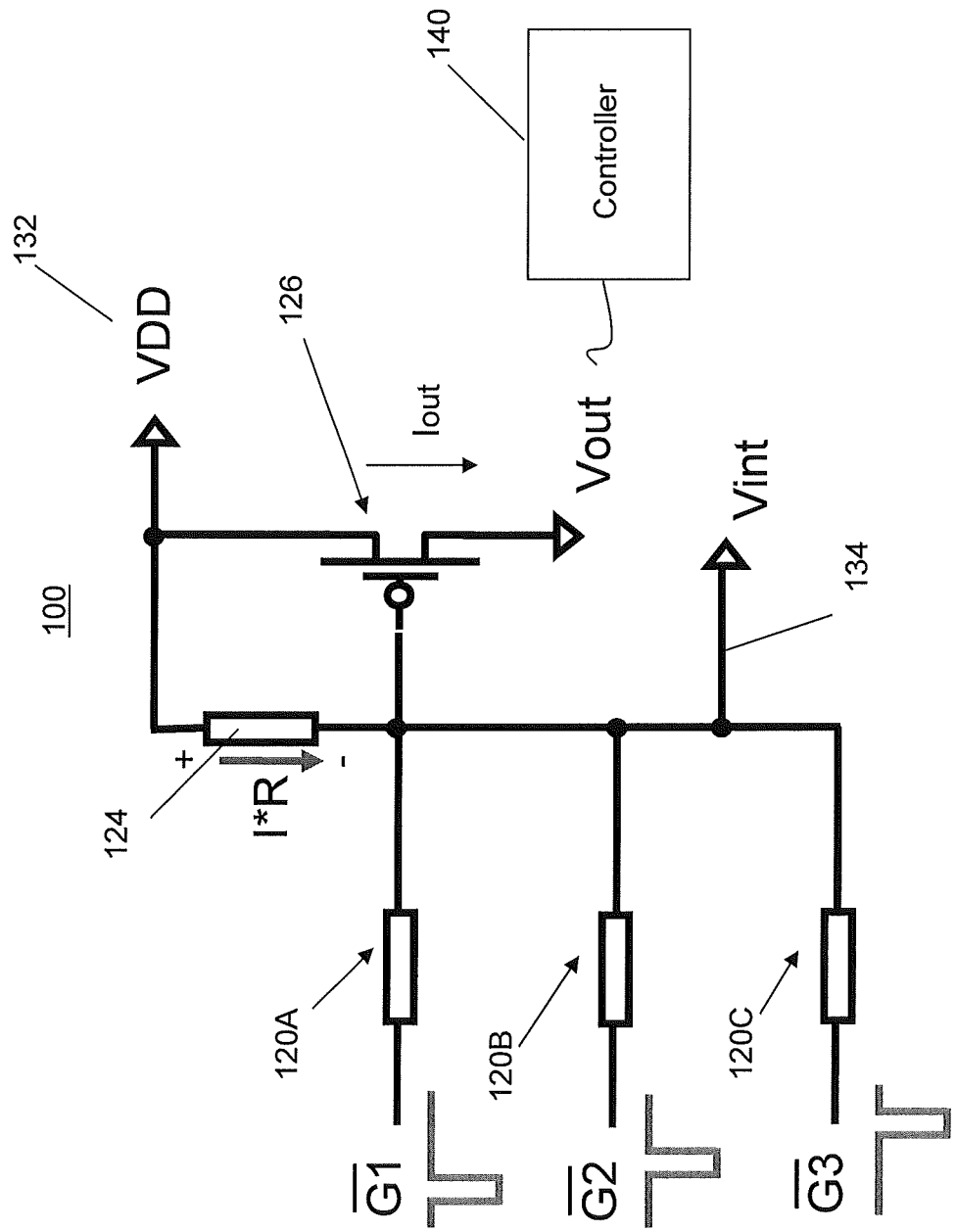
FIG. 3 is a schematic of a test structure for measuring a sigma of a second sampling parameter in accordance with one exemplary embodiment of the present invention.
Figure 4:
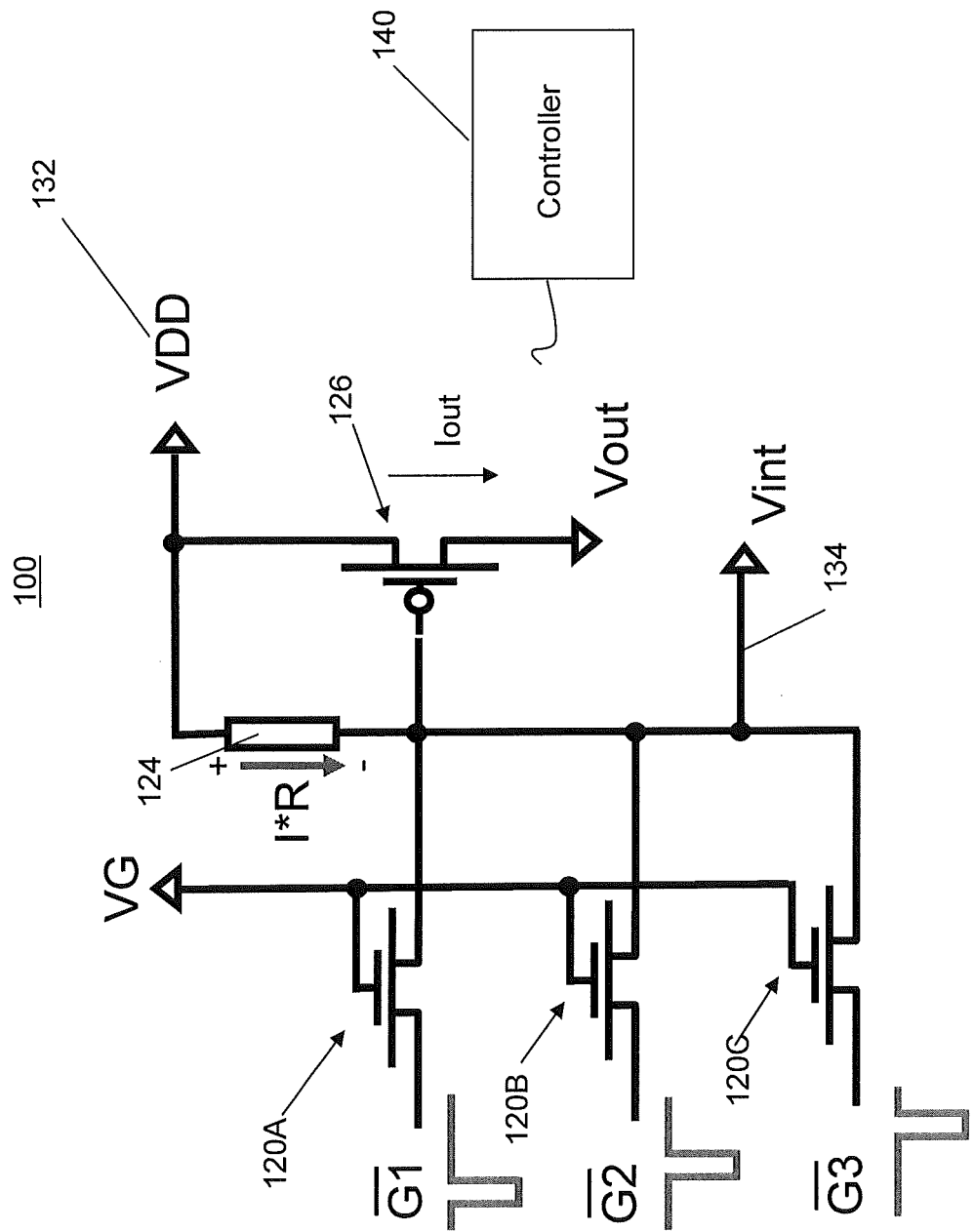
FIG. 4 is a schematic of a test structure for measuring a sigma of a third sampling parameter for linear components in accordance with one exemplary embodiment of the present invention.

It is contemplated that the sigma of other sampling parameters can be measured. For example, the statistical characterization of the random variation of the resistance in each of the sampling devices 120A-120C can be measured using the equations and techniques described above. The test structure for measuring this sigma is shown in FIG. 3. The sigma for other linear parameters (e.g., drive currents with less background leakage) can also be measured as shown in FIG. 4 using the equations and techniques described above and through simple conversions of the output current.

Figure 5:
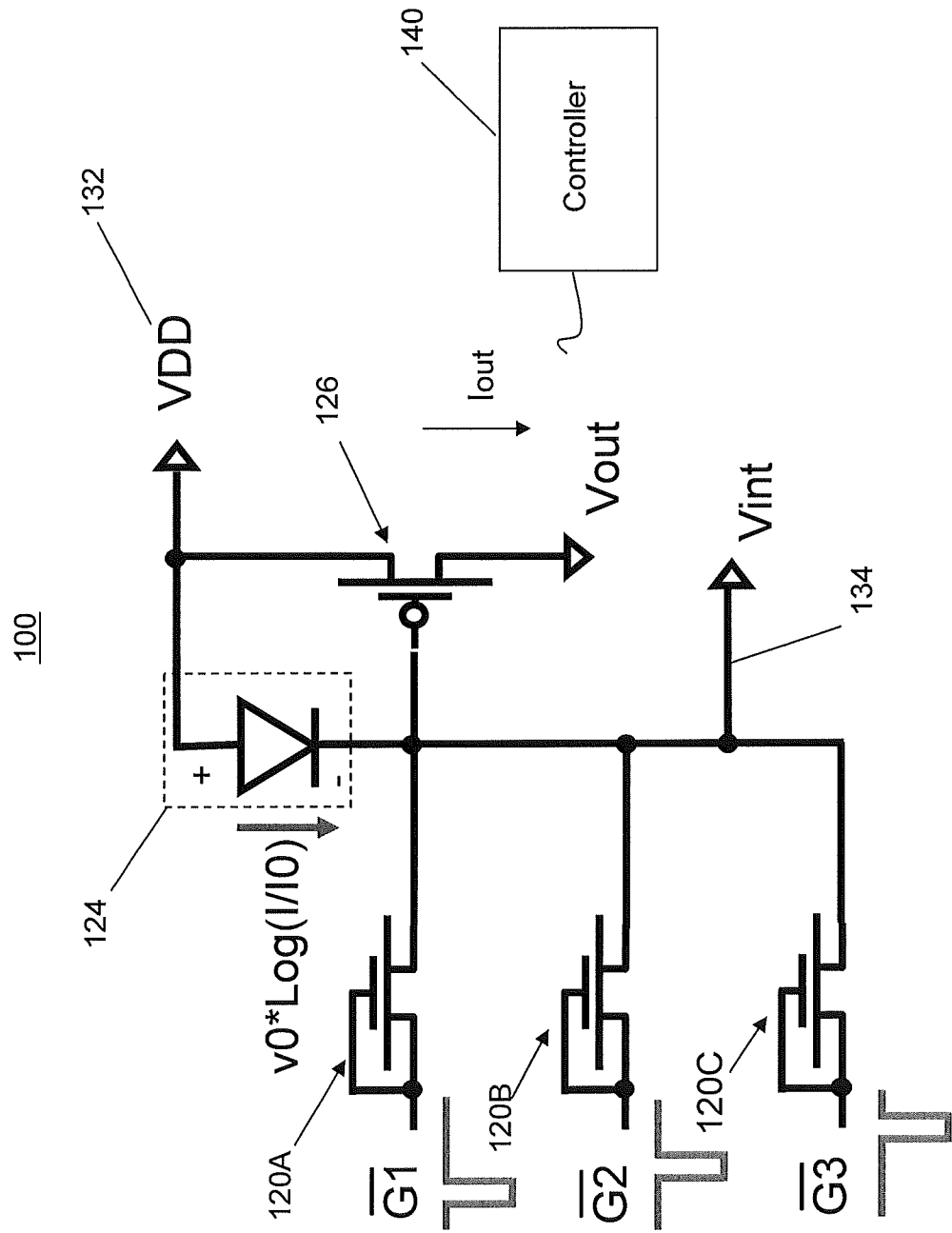
FIGS. 5-7 illustrate a schematic of test structures for measuring a sigma of sampling parameters for log components in accordance with one exemplary embodiment of the present invention.
Figure 6:
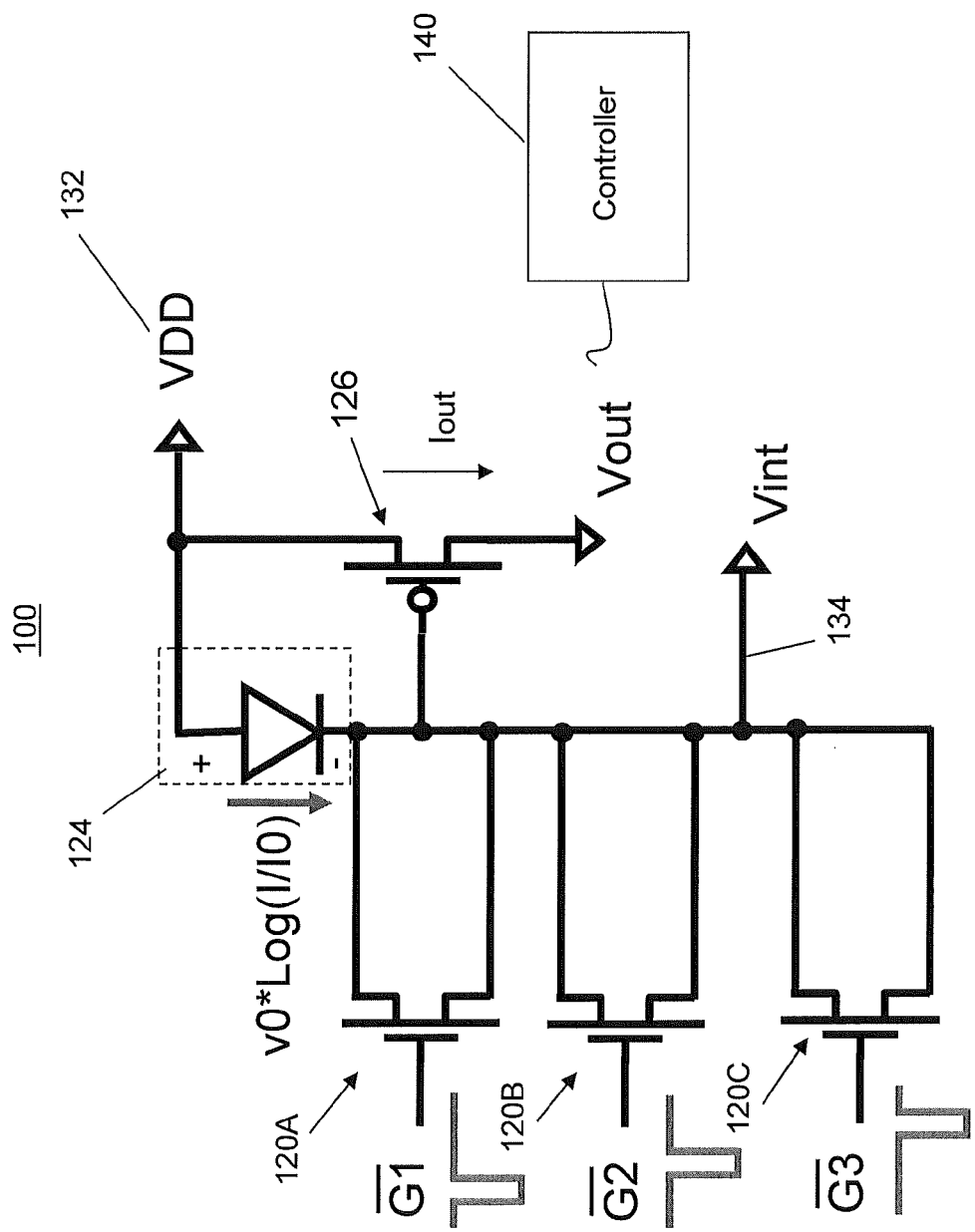
Figure 7:
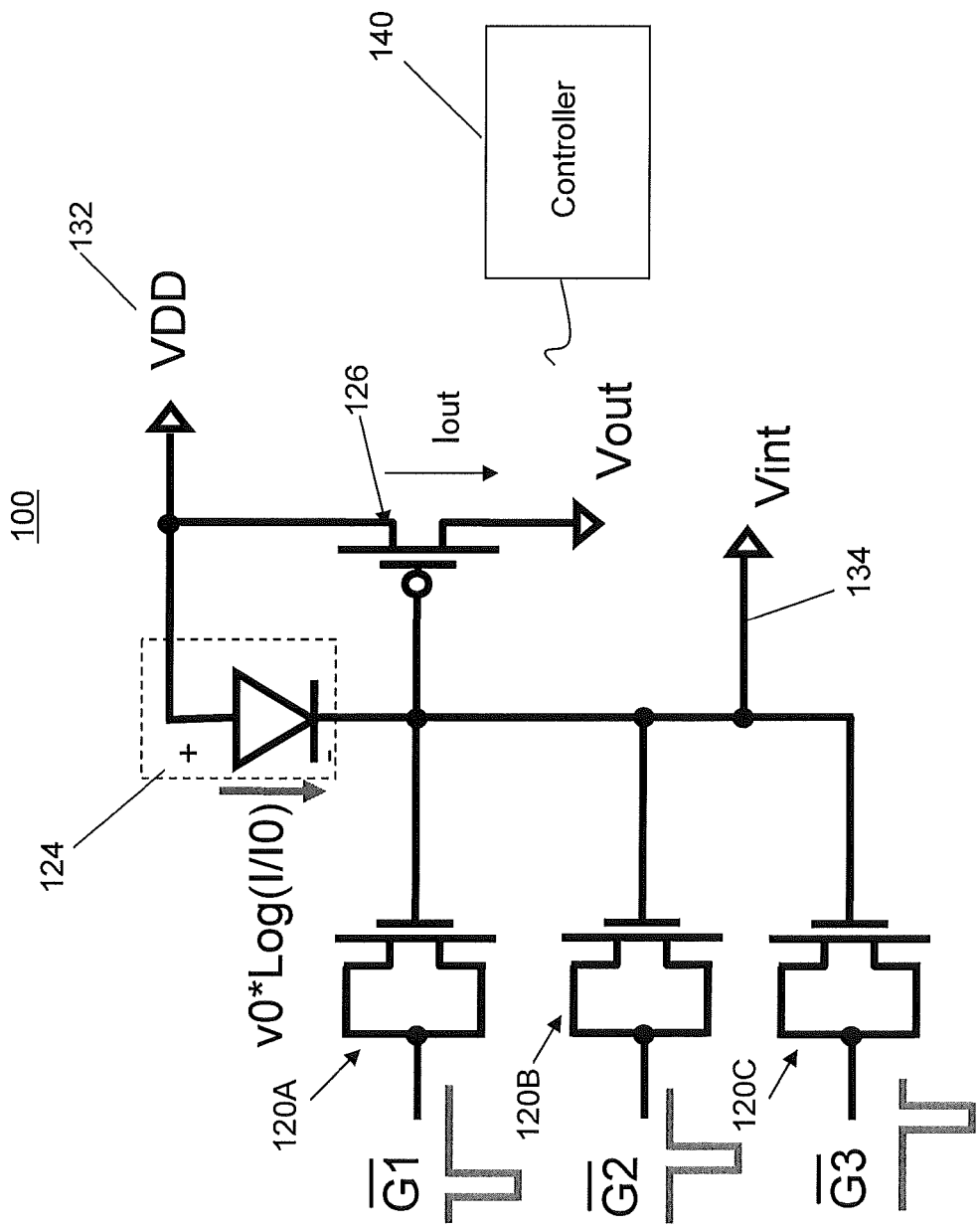

It is further contemplated that the sigma for exponential parameters (e.g., channel leakage, gate leakage, etc.) can be measured as illustrated in FIGS. 5-7. In the sampling current (I), which is the gate leakage current, will be an exponential function of the applied gate voltage on the transistor device 126, hence it's statistical behavior does not map into a Gaussian distribution. For exponential parameters, a diode is used as the electrical element 124 since the behavior of the log of these parameters follows linear Gaussian functions. The sigma for exponential parameters can be determined by using the techniques described above and the calculated sigma represented by equation 1. However, for exponential parameters, the output current ($I_{out}$) for transistor device 126 when the transistor device 126 is placed in the saturation region is calculated by equation 4:

$$I_{OUT} = \frac{K}{2}\overline{\left(v_o \log\left(\frac{I}{I_o}\right) - V_{TH}\right)^2} \qquad \text{(equation 4)}$$

In this equation, the output current ($I_{out}$) is a function of the saturation current $I_o$ of the electrical element 124, which in this case is a diode, the sampling current (I), the building potential $v_o$ of the electrical element 124, the threshold voltage ($V_{TH}$) of the transistor device 126, and the transconductance (K) of the transistor device 126. As such, the voltage applied across the diode is the log of the current through the diode.

For exponential parameters, the output current ($I_{out}$) for transistor device 126 when the transistor device 126 is placed in the linear region is calculated by equation 5:

$$I_{OUT} = K\left(\overline{v_o \log\left(\frac{I}{I_o}\right)} - V_{TH} - \frac{1}{2}(V_{DD} - V_{out})\right)(V_{DD} - V_{out}) \quad \text{(equation 5)}$$

In this equation, $I_{out}$ is a function of the saturation current $I_o$ of the electrical element 124, which in this case is a diode, the sampling current (I), the building potential $v_o$ of the electrical element 124, the sampling current (I), the threshold voltage ($V_{TH}$) of the transistor device 126, and the transconductance (K) of the transistor device 126, the biasing voltage $V_{DD}$ and the output voltage $V_{out}$.

As such, the sigma for exponential parameters can be measured by calculating the output current of the transistor device 126 when the transistor device 126 is placed in both the saturation region and the linear region using equations 4 and 5 and by utilizing a diode as electrical element 124 to extract parameters of the sampling devices.

Figure 8:
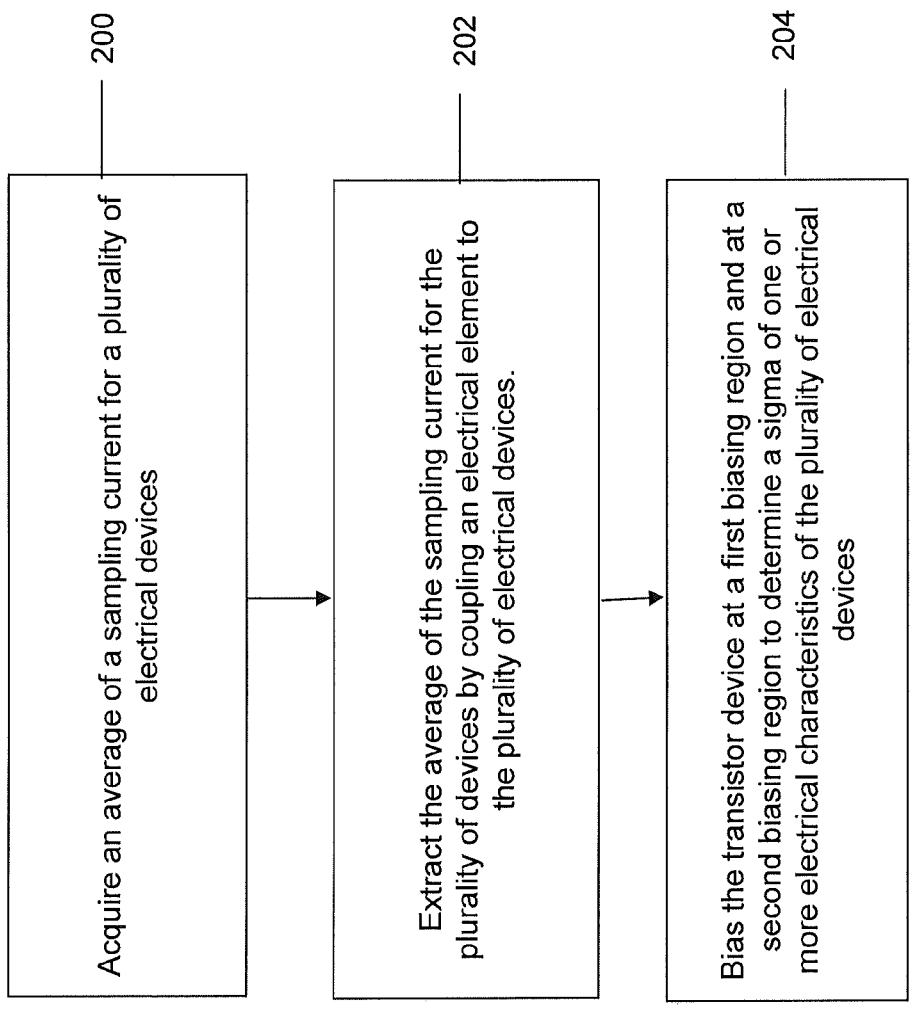
FIG. 8 illustrates a flow diagram that provides a method for measuring random variation in integrated circuit devices in accordance with one exemplary embodiment of the present invention.

Now referring to FIG. 8, a method for measuring random variation in integrated circuit devices in accordance with one exemplary embodiment will now be discussed.

At block 200, acquire an average of a sampling current for a plurality of electrical devices.

At block 202, extract the average of the sampling current for the plurality of devices by coupling an electrical element to the plurality of electrical devices. In one embodiment, the electrical element operably transfers the average of the sampling current to an applied voltage on a transistor device coupled to the electrical element and the plurality of electrical devices.

At block 204, bias the transistor device at a first biasing region and at a second biasing region to determine a sigma of one or more electrical characteristics of the plurality of electrical devices.

The sigma of one or more electrical characteristics (e.g., drive currents, leakage, resistances, etc) of the plurality of electrical devices is determined by calculating an average of the square of an output of the transistor device when the transistor device is biased at the first biasing region (i.e., saturation region) and calculating the square of the average of the output of the transistor device when the transistor device is biased at the second biasing region (i.e., linear region) using the techniques and equations described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for measuring random variation in a plurality of electrical devices, comprising:
   acquiring an average of a sampling current for the plurality of electrical devices;
   extracting the average of the sampling current for the plurality of devices by coupling an electrical element to the plurality of electrical devices, the electrical element operably transfers the average of the sampling current to an applied voltage on a transistor device coupled to the electrical element and the plurality of electrical devices; and
   biasing the transistor device at a first biasing region and at a second biasing region to determine a sigma of one or more electrical characteristics of the plurality of electrical devices.

2. The method of claim 1, wherein the sigma of one or more electrical characteristics of the plurality electrical devices is determined by calculating an average of the square of an output of the transistor device when the transistor device is biased at the first biasing region and calculating the square of the average of the output of the transistor device when the transistor device is biased at the second biasing region.

3. The method of claim 2, wherein the average of the square of the output of the transistor device and the square of the average of the output of the transistor device is calculated by measuring electrical characteristics of the electrical element and the transistor device.

4. The method of claim 2, wherein the output of the transistor device when the transistor device is biased at the first biasing region is calculated utilizing equation $$I_{OUT} = \frac{K}{2}\overline{(IR - V_{TH})^2},$$

wherein $I_{out}$ is the output, K is a transconductance of the transistor device, R is a resistance of the electrical element, I is the sampling current for the plurality of electrical devices, and $V_{TH}$ is a threshold voltage of the transistor device.

5. The method of claim 2, wherein the output of the transistor device when the transistor device is biased at the second biasing region is calculated utilizing equation $$I_{OUT} = K\left(\overline{IR} - V_{TH} - \frac{1}{2}(V_{DD} - V_{out})\right)(V_{DD} - V_{out}),$$

wherein $I_{out}$ is the output, K is a transconductance of the transistor device, R is a resistance of the electrical element, I is sampling current for the plurality of electrical devices, $V_{TH}$ is the threshold voltage of the transistor device, $V_{DD}$ is the applied voltage to the transistor device, $V_{out}$ is an output voltage of the transistor device.

6. The method of claim 2, wherein the output of the transistor device when the transistor device is biased at the first biasing region is calculated utilizing equation $$I_{OUT} = \frac{K}{2}\overline{\left(v_o\log\left(\frac{I}{I_o}\right) - V_{TH}\right)^2},$$

wherein $I_{out}$ is the output, K is a transconductance of the transistor device, R is a resistance of the electrical element, I is the sampling current for the plurality of electrical devices, $V_{TH}$ is a threshold voltage of the transistor device, $v_o$ is a building potential of the electrical element, and $I_o$ is a saturation current of the electrical element.

7. The method of claim 2, wherein the output of the transistor device when the transistor device is biased at the second biasing region is calculated utilizing equation $$I_{OUT} = K\left(\overline{v_o\log\left(\frac{I}{I_o}\right)} - V_{TH} - \frac{1}{2}(V_{DD} - V_{out})\right)(V_{DD} - V_{out}),$$

wherein $I_{out}$ is the output, K is a transconductance of the transistor device, R is a resistance of the electrical element, I is the sampling current for the plurality of electrical devices, $V_{TH}$ is the threshold voltage of the transistor device, $V_{DD}$ is the applied voltage to the transistor device, $V_{out}$ is an output voltage of the transistor device, $v_o$ is a building potential of the electrical element, and $I_o$ is a saturation current of the electrical element.

8. The method of claim 1, wherein the first biasing region is a saturation region and the second biasing region is a linear region.

9. The method of claim 1, wherein the average of the sampling current for the plurality of electrical devices is acquired by coupling an oscillator circuit to the plurality of electrical devices, the oscillator circuit drives the plurality of electrical devices at different time divisions of a sampling period.

10. The method of claim 1, wherein the applied voltage to the transistor device is linearly proportional to the sampling current for the plurality of electrical devices or is proportional to the log of the sampling current for the plurality of the electrical devices.

11. The method of claim 1, wherein the sigma is a statistical characterization of the variation of one or more electrical characteristics of the plurality of electrical devices.

12. A method for measuring random variation in a plurality of electrical devices, comprising:
 acquiring an average of a sampling current for the plurality of electrical devices;
 extracting the average of the sampling current for the plurality of devices by coupling an electrical element to the plurality of electrical devices, the electrical element operably transfers the average of the sampling current to an applied voltage on a transistor device coupled to the electrical element and the plurality of electrical devices; and
 biasing the transistor device at a saturation region and at a linear region to determine a sigma of one or more electrical characteristics of the plurality of electrical devices.

13. The method of claim 12, wherein the sigma of one or more electrical characteristics of the plurality electrical devices is determined by calculating an average of the square of an output of the transistor device when the transistor device is biased at the saturation region and calculating the square of the average of the output of the transistor device when the transistor device is biased at the linear region.

14. The method of claim 13, wherein the average of the square of the output of the transistor device and the square of the average of the output of the transistor device is calculated by measuring electrical characteristics of the electrical element and the transistor device.

15. The method of claim 12, wherein the average of the sampling current for the plurality of electrical devices is acquired by coupling an oscillator circuit to the plurality of electrical devices, the oscillator circuit drives the plurality of electrical devices at different time divisions of a sampling period.

16. A test structure, comprising:
 a plurality of electrical devices;
 an oscillating circuit in electrical communication with the plurality of devices, the oscillating circuit configured to drive the plurality of electrical devices at different time divisions of a sampling period to acquire an average of a sampling current for the plurality of electrical devices; and
 an electrical element in electrical communication with the plurality of electrical devices, the electrical element operably transfers the average of the sampling current for the plurality of electrical devices to an applied voltage to a transistor device coupled with the plurality of electrical devices, the transistor device is biased at a first biasing region and at a second biasing region to determine a sigma of one or more electrical characteristics of the plurality of electrical devices.

17. The test structure of claim 16, wherein the sigma of one or more electrical characteristics of the plurality electrical devices is determined by calculating an average of the square of an output of the transistor device when the transistor device is biased at the first biasing region and calculating the square of the average of the output of the transistor device when the transistor device is biased at the second biasing region.

18. The test structure of claim 17, wherein the average of the square of the output of the transistor device and the square of the average of the output of the transistor device is calculated by measuring electrical characteristics of the electrical element and the transistor device.

19. The test structure of claim 16, wherein the applied voltage to the transistor device is linearly proportional to the sampling current for the plurality of electrical devices or is proportional to the log of the sampling current for the plurality of the electrical devices.

20. The test structure of claim 16, wherein the first biasing region is a saturation region and the second biasing region is a linear region.

* * * * *